(12) United States Patent
Tanaka

(10) Patent No.: US 7,834,415 B2
(45) Date of Patent: Nov. 16, 2010

(54) SEMICONDUCTOR DEVICE WITH TRENCH ISOLATION STRUCTURE AND METHOD OF MANUFACTURING THE SAME

(75) Inventor: Yoshinori Tanaka, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 709 days.

(21) Appl. No.: 11/702,676

(22) Filed: Feb. 6, 2007

(65) Prior Publication Data

US 2007/0221977 A1    Sep. 27, 2007

(30) Foreign Application Priority Data

Mar. 24, 2006   (JP) .............................. 2006-082616

(51) Int. Cl.
*H01L 29/00* (2006.01)

(52) U.S. Cl. ....................... 257/510; 257/506; 257/501; 257/513

(58) Field of Classification Search ................. 257/649, 257/305, 774, 524, 639, 640, 510, 647, 523, 257/501, 506

See application file for complete search history.

(56) References Cited

U.S. PATENT DOCUMENTS

| | | | | |
|---|---|---|---|---|
| 5,686,329 A | * | 11/1997 | Chang et al. | ................. 438/253 |
| 5,763,315 A | * | 6/1998 | Benedict et al. | ............. 438/424 |
| 7,190,036 B2 | * | 3/2007 | Ko et al. | ...................... 257/374 |

FOREIGN PATENT DOCUMENTS

JP        2005-322859        11/2005

* cited by examiner

*Primary Examiner*—Chuong Anh Luu
(74) *Attorney, Agent, or Firm*—McGinn IP Law Group, PLLC

(57) ABSTRACT

A semiconductor device has: a substrate provided with a trench; and a device isolation structure formed in the trench. The device isolation structure has: a silicon oxynitride film formed on a surface of the substrate through an interfacial oxide film; and an embedded insulating film formed on the silicon oxynitride film.

9 Claims, 15 Drawing Sheets

SEMICONDUCTOR DEVICE WITH TRENCH ISOLATION STRUCTURE AND METHOD OF MANUFACTURING THE SAME

BACKGROUND OF THE INVENTION

1. Field of the Invention

The present invention relates to a semiconductor device and a method of manufacturing thereof. In particular, the present invention relates to a semiconductor device having an STI (Shallow Trench Isolation) structure and a method of manufacturing thereof.

2. Description of the Related Art

In a semiconductor device such as a DRAM or the like, a device isolation structure is formed in order to isolate elements from one another. An STI structure is well known as the device isolation structure, in which a trench on a substrate is filled with an insulating film.

FIG. 1 is a cross-sectional view illustrating a conventional STI structure. As shown in FIG. 1, a silicon substrate 101 is provided with a trench 105. The trench 105 is filled with an STI structure 140 as the device isolation structure. More specifically, a silicon thermal oxide film 110 is formed on a surface of the silicon substrate 101 in the trench 105. In addition, a CVD oxide film 120 is formed on the silicon thermal oxide film 110. That is to say, a surface of the trench 105 is covered with the silicon thermal oxide film 110, and the other region within the trench 105 is filled with the CVD oxide film 120. The silicon thermal oxide film 110 and the CVD oxide film 120 form the STI structure 140.

Moreover, as shown in FIG. 2, a silicon nitride film (SiN film) 130 may be formed between the silicon thermal oxide film 110 and the CVD oxide film 120 (for example, refer to Japanese Laid-Open Patent Application JP-P2005-322859). In this case, the silicon thermal oxide film 110, the silicon nitride film 130 and the CVD oxide film 120 form the STI structure 140.

As shown in FIGS. 1 and 2, the device isolation is achieved by the STI structure 140 and an active region Ra of a transistor is so formed as to be surrounded by adjacent STI structures 140. Here, a width of the active region Ra, namely, an interval between the adjacent STI structures 140 is "W2".

A method of manufacturing the conventional STI structure 140 described above is as follows. For example, FIGS. 3 to 7 sequentially show processes of manufacturing the STI structure 140 illustrated in FIG. 1.

First, as shown in FIG. 3, a silicon thermal oxide film 102 and a silicon nitride film 103 are deposited in series on the silicon substrate 101. Further, a resist mask 104 having a predetermined pattern is formed on the silicon nitride film 103 by the photolithography technique.

Next, the silicon nitride film 103 and the silicon thermal oxide film 102 at an opening of the resist mask 104 are removed by a dry etching using the resist mask 104. Then, the resist mask 104 is removed. As a result, an SiN mask 106 for forming a trench is formed, as shown in FIG. 4. Subsequently, a dry etching of the silicon substrate 101 is performed by using the SiN mask 106. Consequently, as shown in FIG. 4, the trench 105 is formed at a region where the STI structure is embedded. At this point, an interval between adjacent trenches 105, namely, a width of a region corresponding to the active region Ra is "W1".

Next, as shown in FIG. 5, the silicon thermal oxide film 110 with a thickness of about 10 nm is formed on the exposed surface of the trench 105 by a thermal oxidation method. The thermal oxidation recovers damages on the substrate surface that have been generated by the dry etching (trench etching) for forming the above-mentioned trench 105 (refer to Japanese Laid-Open Patent Application JP-P2005-322859). It is said that junction leakage characteristic is improved due to the damage recovery. As a result of the thermal oxidation of the substrate surface, the width of the active region Ra becomes "W2" that is narrower than the above-mentioned "W1".

Next, as shown in FIG. 6, a CVD oxide film 115 is deposited by a high-density plasma CVD (HDP-CVD) method such that the inside of the trench 105 is completely filled with the CVD oxide film 115. Here, the above-mentioned silicon oxide film 110 covering the surface of the trench 105 plays a role of protecting the substrate surface from the high-density plasma.

Next, as shown in FIG. 7, the surplus CVD oxide film 115 is removed by CMP (Chemical Mechanical Polishing) and the CVD oxide film 120 of the STI structure is formed. Here, the SiN mask 106 is used as a stopper. After that, the SiN mask 106 and a part of the CVD oxide film 120 are removed by a wet etching. As a result, the STI structure 140 shown in FIG. 1 is obtained.

According to the conventional technique, as described above, the silicon thermal oxide film 110 covering the surface of the trench 105 is formed by the direct thermal oxidation of the exposed surface of the trench 105. Consequently, the damages on the substrate surface caused by the trench etching are recovered, and moreover the substrate surface is protected during the HDP-CVD process. Thus, the junction leakage characteristic is prevented from deterioration.

SUMMARY OF THE INVENTION

The inventor of the present application has noticed the following points. According to the conventional technique, the width of the active region Ra is decreased from "W1" to "W2" due to the above-mentioned thermal oxidation of the exposed surface of the trench. In other words, the above-mentioned thermal oxidation process expands the STI structure and shrinks the active region Ra where the transistor is formed. The reduction of the active region Ra causes decrease in performance of the transistor. In a case of the DRAM, for example, write characteristics with respect to a memory cell deteriorate due to the decrease in performance of a memory cell transistor. In particular, the device is becoming smaller in recent years, and the size of the active region Ra is designed as small as possible in a layout design stage. The further reduction of the size of active region Ra in the manufacturing process (the thermal oxidation process) has serious effects on the performance of the transistor.

An object of the present invention is to provide a new STI structure and a method of manufacturing thereof.

Another object of the present invention is to provide an STI structure that does not shrink an active region and a method of manufacturing thereof.

Still another object of the present invention is to provide an STI structure that can prevent deterioration of leakage characteristic and a method of manufacturing thereof.

Still another object of the present invention is to provide an STI structure that can improve performance of a transistor with preventing deterioration of leakage characteristic and a method of manufacturing thereof.

Still another object of the present invention is to provide a semiconductor device in which leakage characteristic and performance are improved and a method of manufacturing thereof.

Still another object of the present invention is to provide a technique that can improve refresh (retention) characteristics and write characteristics of a DRAM.

In a first aspect of the present invention, a semiconductor device is provided. The semiconductor device has: a substrate provided with a trench; and a device isolation structure formed in the trench. The device isolation structure has: a silicon oxynitride film formed on a surface of the substrate through an interfacial oxide film; and an embedded insulating film formed on the silicon oxynitride film.

It is preferable that refractive index of the silicon oxynitride film is in a range from 1.6 to 1.9. The interfacial oxide film is different from the conventionally formed thermal oxide film (110) mentioned above, and the thickness of the interfacial oxide film is not more than 1 nm. The embedded insulating film is a CVD oxide film formed by the CVD method.

In the semiconductor device according to the present invention, rounding portions may be formed at a top corner and a bottom corner of the trench, respectively.

The semiconductor device according to the present invention can be a DRAM. In this case, the semiconductor device further has: a MOS transistor formed on an active region of the substrate surrounded by the device isolation structure; and a capacitor connected to a diffusion layer (source or drain) of the MOS transistor.

In a second aspect of the present invention, a method of manufacturing a semiconductor device is provided. The manufacturing method includes: (A) a process of forming a trench on a substrate by an etching; and (B) a process of forming a device isolation structure in the trench. The (B) process includes: (B1) a process of forming a silicon oxynitride film on a surface of the substrate in the trench; (B2) a process of annealing in oxidizing atmosphere after the (B1) process.

The silicon oxynitride film has "oxygen permeability". Therefore, in the above-mentioned (B2) process, a thin interfacial oxide film with a thickness not more than 1 nm is formed at an interface between the substrate and the silicon oxynitride film. The interfacial oxide film plays a role of preventing the leakage current characteristic from deterioration. The reason is as follows. When a silicon nitride film (SiN film) or a silicon oxynitride film (SiON film) directly contacts the silicon substrate, trap and interface state are generally formed at the interface therebetween. The trap and the interface state cause deterioration of the leakage current characteristic. According to the present invention, although the silicon oxynitride film is once formed on the substrate, the thin interfacial oxide film is thereafter formed at the interface by the above-mentioned (B2) process that utilizes the oxygen permeability of the silicon oxynitride film. As a result, the formation of the peculiar trap and the interface state at the interface can be prevented. That is to say, the deterioration of the leakage current characteristic can be prevented.

Moreover, it should be noted that the direct thermal oxidation process, which has been conventionally performed with respect to the exposed surface of the trench, is omitted and not performed at the time when the above-described interfacial oxide film is formed. Instead, the silicon oxynitride film is formed on the exposed surface of the trench, and then the thin interfacial oxide film is formed at the interface by the above-mentioned (B2) process that utilizes the oxygen permeability of the silicon oxynitride film. Since the conventional direct thermal oxidation process with respect to the exposed surface is omitted, the active region where the transistor is formed does not shrink. Therefore, the performance of the transistor is improved as compared with the conventional technique. Particularly in a case of a DRAM, the performance of the memory cell transistor is prevented from deterioration, and the write characteristics with respect to a memory cell are improved.

The manufacturing method according to the present invention may further include: (C) a process of annealing in $H_2$ atmosphere between the (A) process and the (B) process. As a result, damages on the substrate surface caused by the trench etching in the (A) process can be recovered. Due to the damage recovery, the junction leakage characteristic is improved. Although the direct thermal oxidation process with respect to the exposed surface of the trench is omitted according to the present invention, the damages caused by the trench etching can be removed and thus the excellent leakage characteristic can be maintained.

Moreover, the (C) process has an effect of rounding a top corner and a bottom corner of the trench. In other words, rounding portions are respectively formed at the top corner and the bottom corner of the trench by the (C) process. During the processes of manufacturing the semiconductor device, various stresses are applied to the top corner and the bottom corner of the trench and hence crystal defects are likely to occur. Due to the rounding of the top corner and the bottom corner of the trench, the stresses with respect to the corners are dispersed and the occurrence of the crystal defects is suppressed. As a result, the characteristics of the semiconductor device are improved. It can be said that the above-mentioned (C) process plays two roles of removing the trench etching damages and forming the rounding portions.

Furthermore, the above-mentioned (A) process can include: (A1) a process of forming a mask having a pattern of the trench on the substrate; and (A2) a process of forming the trench by a dry etching using the mask. In this case, the above-mentioned (C) process includes: (C1) a process of removing a part of the mask by an isotropic etching; and (C2) a process of annealing in $H_2$ atmosphere. As a result of the (C1) process, the edge of the mask used for forming the trench backs away from the top corner of the trench. Therefore, it becomes easy to form the rounding portion at the top corner in the subsequent (C2) process.

According to the present invention, as described above, the new STI structure and the method of manufacturing thereof are provided. According to the STI structure and the manufacturing method, the active region where the transistor is formed does not shrink. Moreover, the deterioration of the leakage characteristic is prevented. Therefore, not only the leakage characteristic but also the performance is improved in the semiconductor device provided with the STI structure according to the present invention. Particularly in the case of a DRAM, not only the refresh (retention) characteristics but also the write characteristics are improved.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

An STI structure, a semiconductor device having the STI structure and a method of manufacturing the semiconductor device according to the present invention will be described below with reference to the attached drawings.

1. First Embodiment 1-1. Structure

Figure 8:
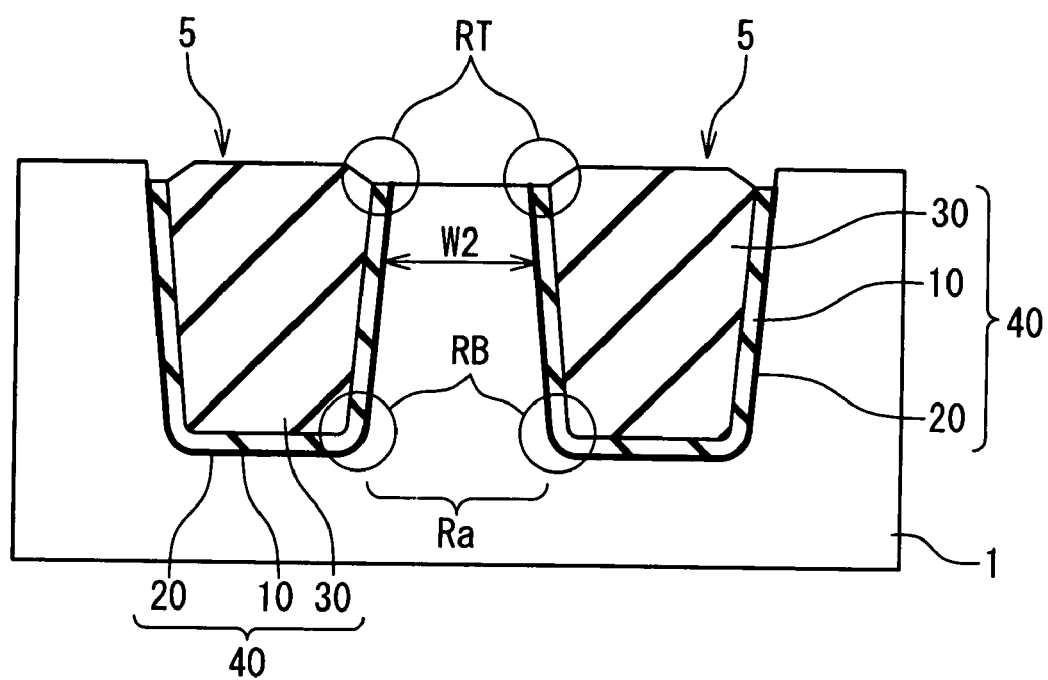
FIG. 8 is a cross-sectional view illustrating an STI structure according to a first embodiment of the present invention.

FIG. 8 is a cross-sectional view illustrating an STI structure according to a first embodiment of the present invention. A silicon substrate 1 is provided with a plurality of trenches 5 that are substantially parallel to each other. An STI structure 40 as a device isolation structure is formed in each trench 105. In other words, each trench 105 is filled with the STI structure 40.

More specifically, a silicon oxynitride film (SiON film) 10 is formed on a surface of the silicon substrate 1 in the trench 5 through a thin interfacial oxide film 20. In addition, an embedded insulating film 30 is formed on the silicon oxynitride film 10. That is to say, the silicon oxynitride film 10 is so formed as to cover the surface of the trench 5, and the thin interfacial oxide film 20 is formed at an interface between the silicon oxynitride film 10 and the silicon substrate 1. The other region within the trench 5 is filled with the embedded insulating film 30. The interfacial oxide film 20, the silicon oxynitride film 10 and the embedded insulating film 30 form the STI structure 40. The device isolation is achieved by the STI structure 40 and an active region Ra of a transistor is so formed as to be surrounded by adjacent STI structures 40. Here, a width of the active region Ra, namely, an interval between the adjacent STI structures 40 is "W2".

Figure 1:
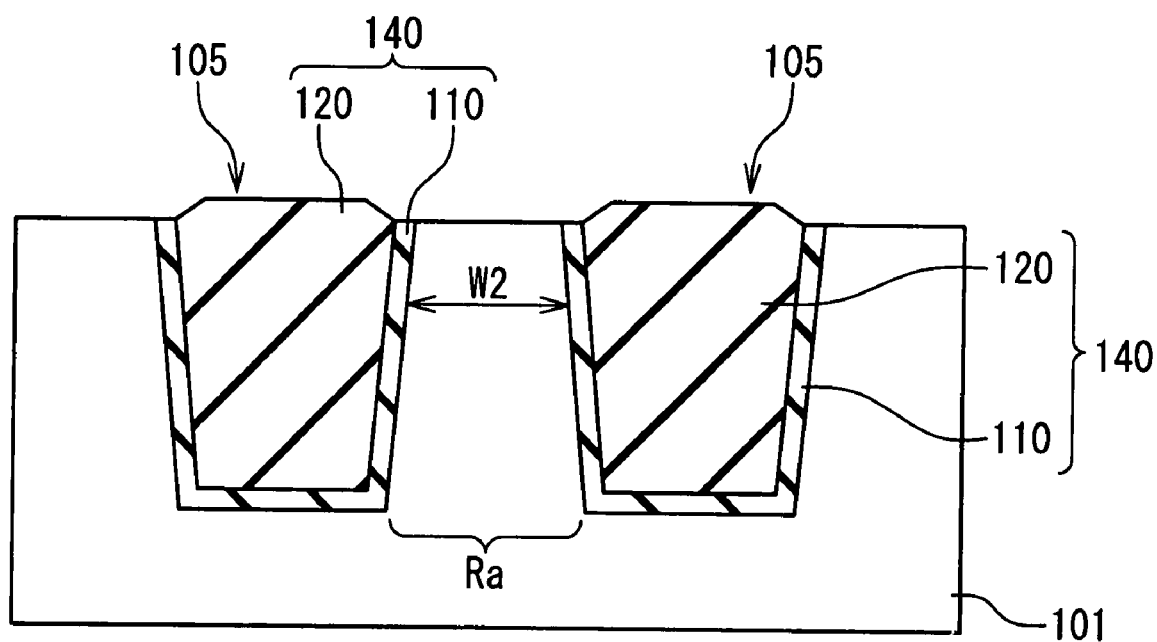
FIG. 1 is a cross-sectional view illustrating a conventional STI structure.
Figure 2:
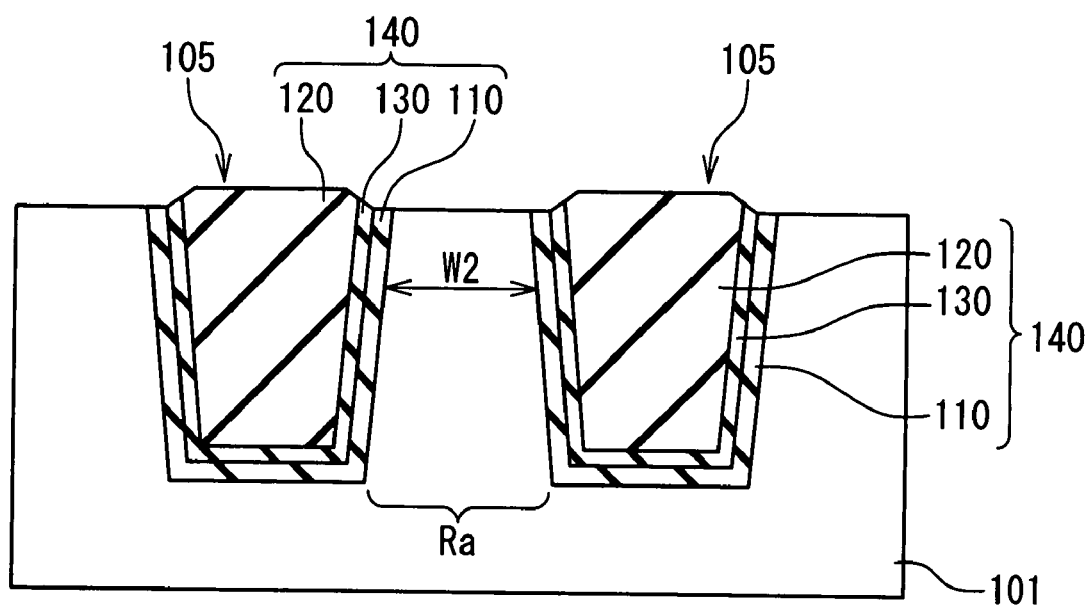
FIG. 2 is a cross-sectional view illustrating another conventional STI structure.
Figure 3:
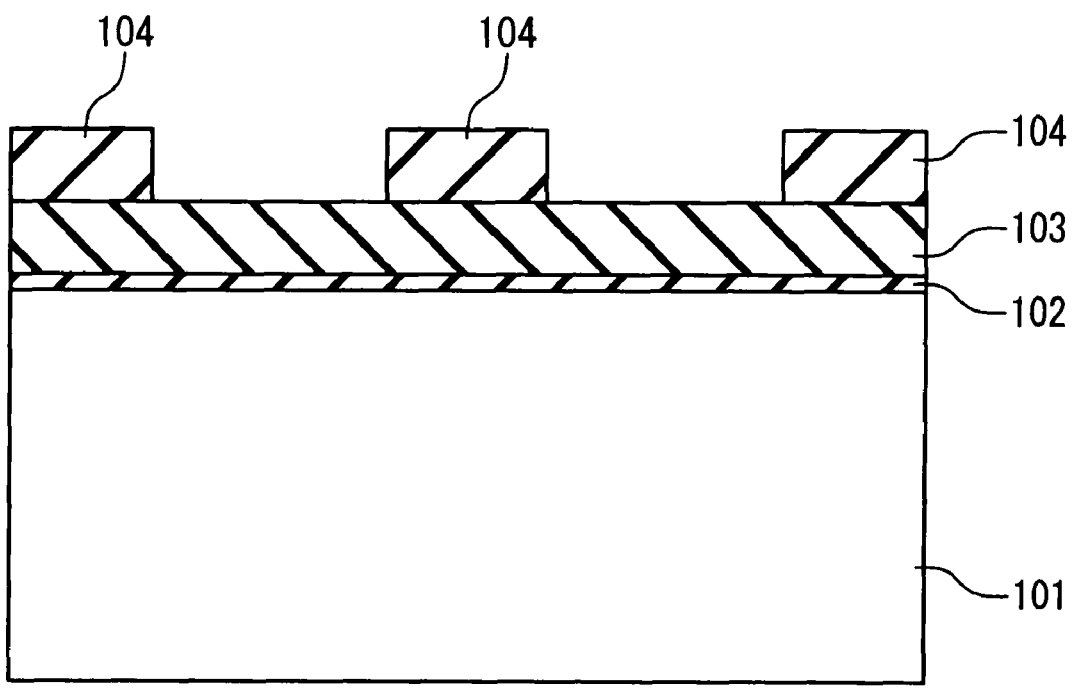
FIGS. 3 to 7 are cross-sectional views showing processes of manufacturing the conventional STI structure.
Figure 4:
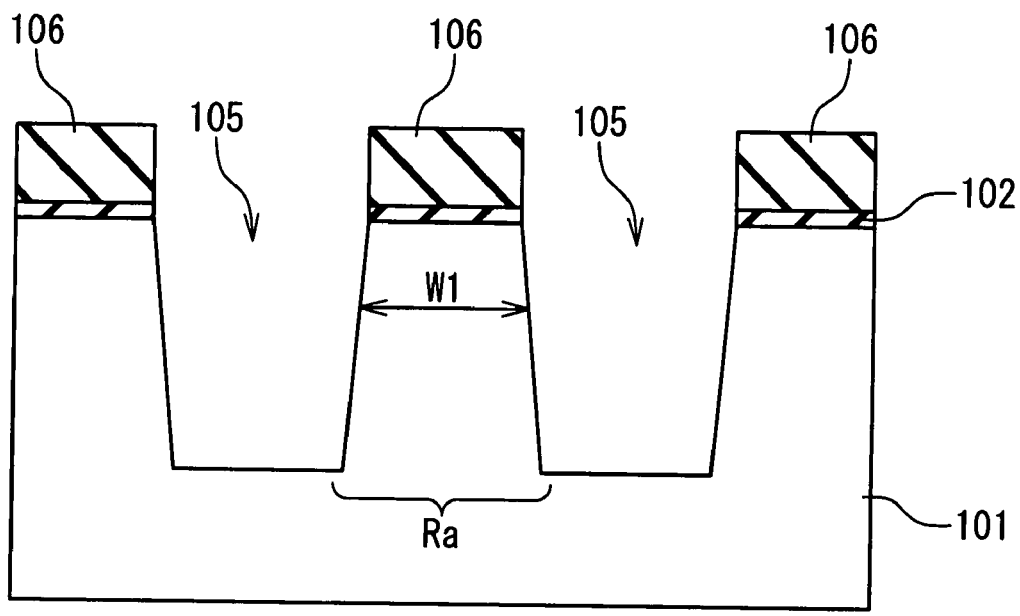
Figure 5:
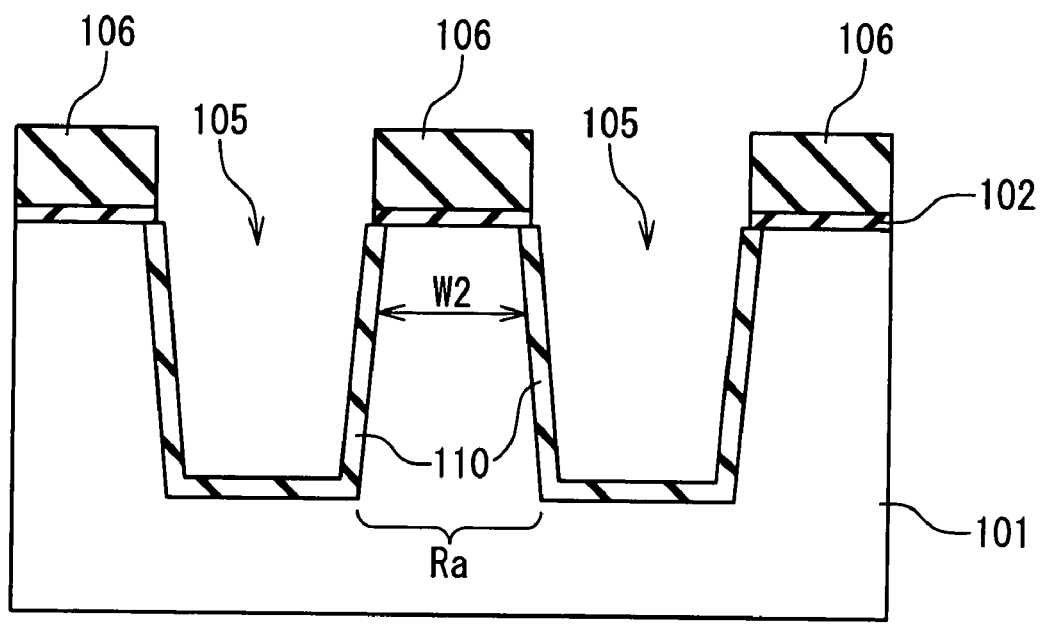
Figure 6:
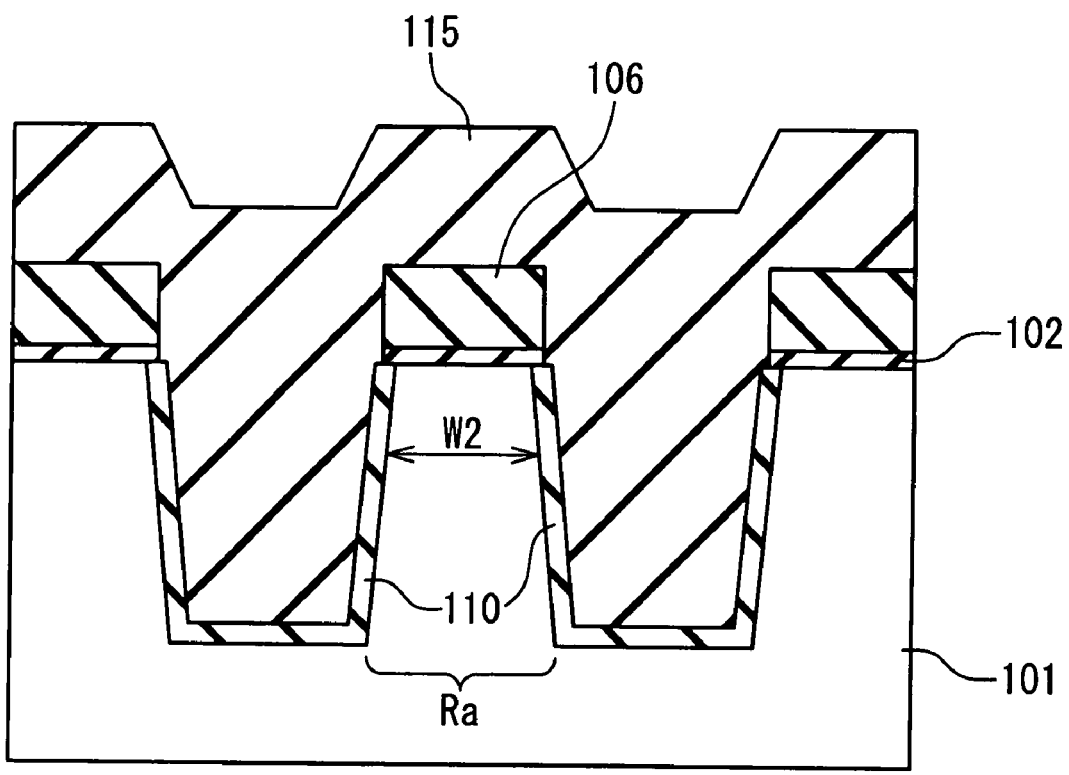
Figure 7:
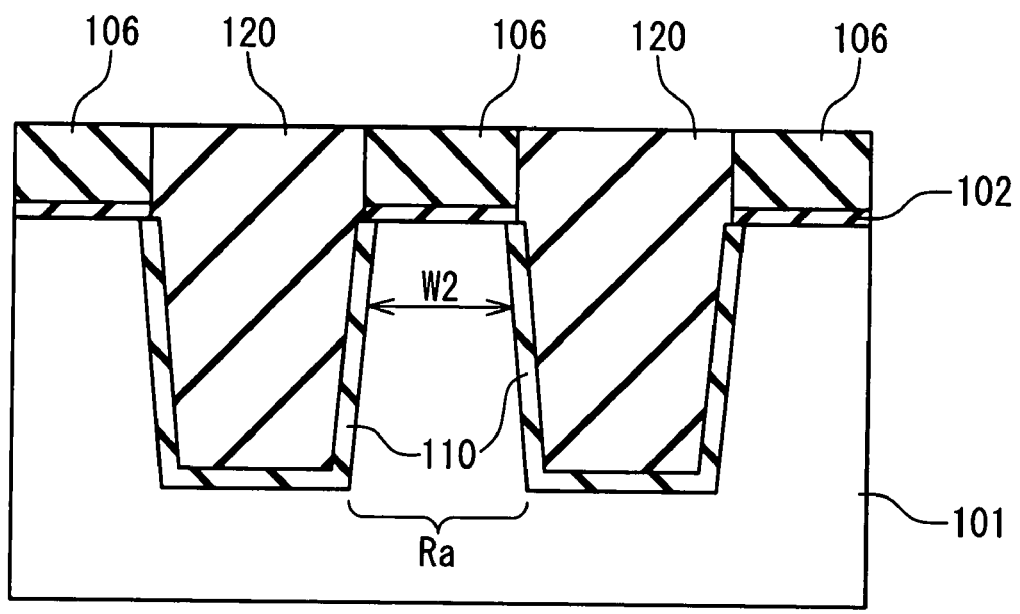

The STI structure 40 according to the present embodiment does not have the conventional thermal oxide film 110 shown in FIG. 1. That is, the thermal oxide film 110 with a thickness of about 10 nm, which is formed by the direct thermal oxidation of the exposed surface of the trench, is not formed in the present embodiment. Instead, the silicon oxynitride film 10 is formed on the surface of the trench 5 through the interfacial oxide film 20. The interfacial oxide film 20 is a thin oxide film formed by a method to be described later. The interfacial oxide film 20 is extremely thin and its thickness is not more than 1 nm. Moreover, the refractive index of the silicon oxynitride film 10 is designed to be in a range from 1.6 to 1.9, as will be described later. The embedded insulating film 30 is exemplified by a CVD oxide film that is formed by a CVD method.

Furthermore, as shown in FIG. 8, rounding portions RT and RB with a rounded shape are formed at a top corner and a bottom corner of the trench 5, respectively. The rounding portions RT and RB are formed by purposely rounding the top corner and the bottom corner of the trench 5, as will be described later.

1-2. Manufacturing Method

Next, a method of manufacturing the STI structure 40 according to the present embodiment will be described below with reference to FIGS. 9 to 14.

Figure 9:
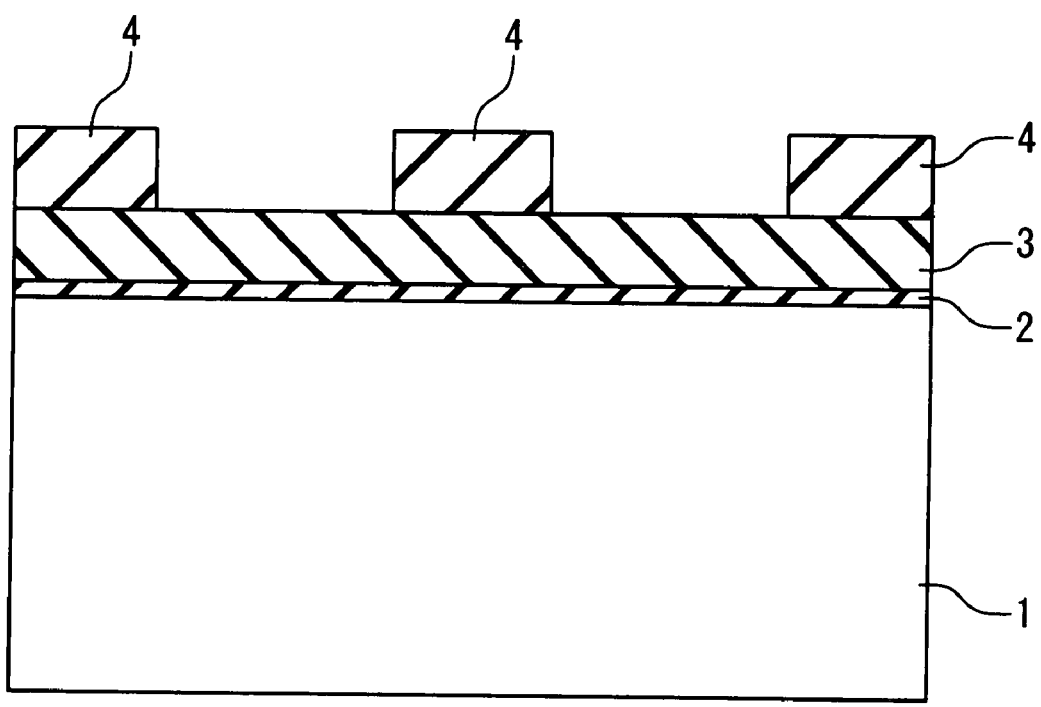
FIGS. 9 to 14 are cross-sectional views showing processes of manufacturing the STI structure according to the first embodiment.

First, as shown in FIG. 9, a silicon thermal oxide film 2 is formed on the silicon substrate 1. The silicon thermal oxide film 2 can be formed by a heat treatment under a temperature of 750 to 1100 degrees centigrade in a lamp apparatus or a furnace. Subsequently, a silicon nitride film (SiN film) 3 is deposited on the silicon thermal oxide film 2 by a CVD method. Further, after a resist is blanket deposited, a resist mask 4 having a predetermined pattern is formed on the silicon nitride film 3 by the photolithography technique. The predetermined pattern has an opening at an area where a trench is to be formed.

Figure 10:
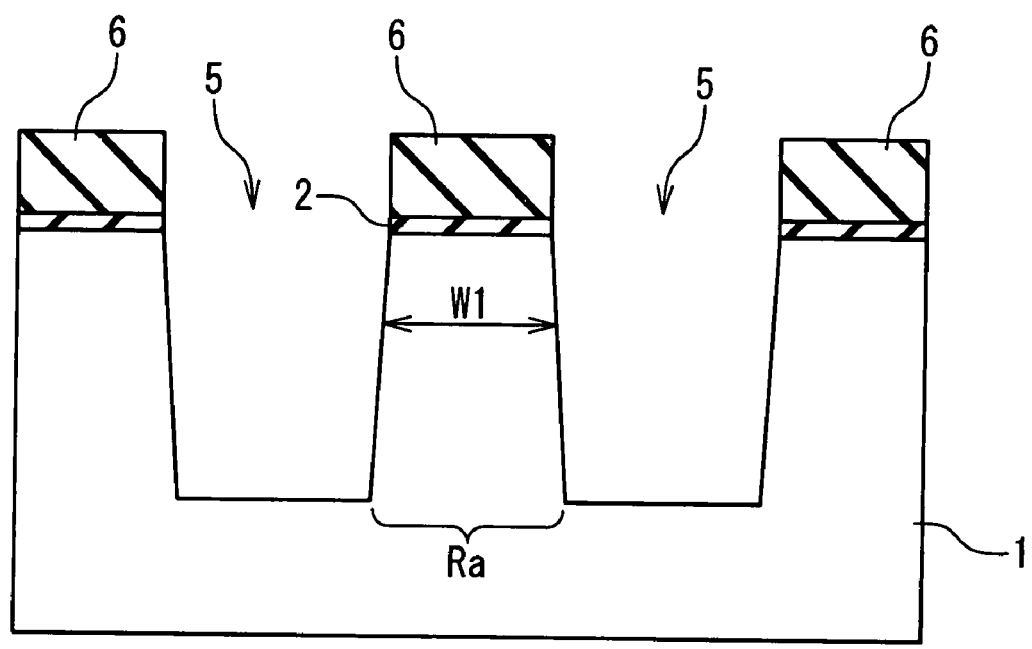

Next, the silicon nitride film 3 and the silicon thermal oxide film 2 at the opening of the resist mask 4 are removed by a dry etching using the resist mask 4. Then, the resist mask 4 is removed. As a result, a mask 6 (hereinafter referred to as an SiN mask) for forming a trench is formed, as shown in FIG. 10. The SiN mask 6 has a pattern of the trench to be formed. Subsequently, a dry etching of the silicon substrate 1 is performed by using the SiN mask 6 (hereinafter referred to as "trench etching"). Consequently, as shown in FIG. 10, the trench 5 is formed at a region where the STI structure is embedded. At this point, an interval between adjacent trenches 5, namely, a width of a region corresponding to the active region Ra is "W1".

Figure 11:
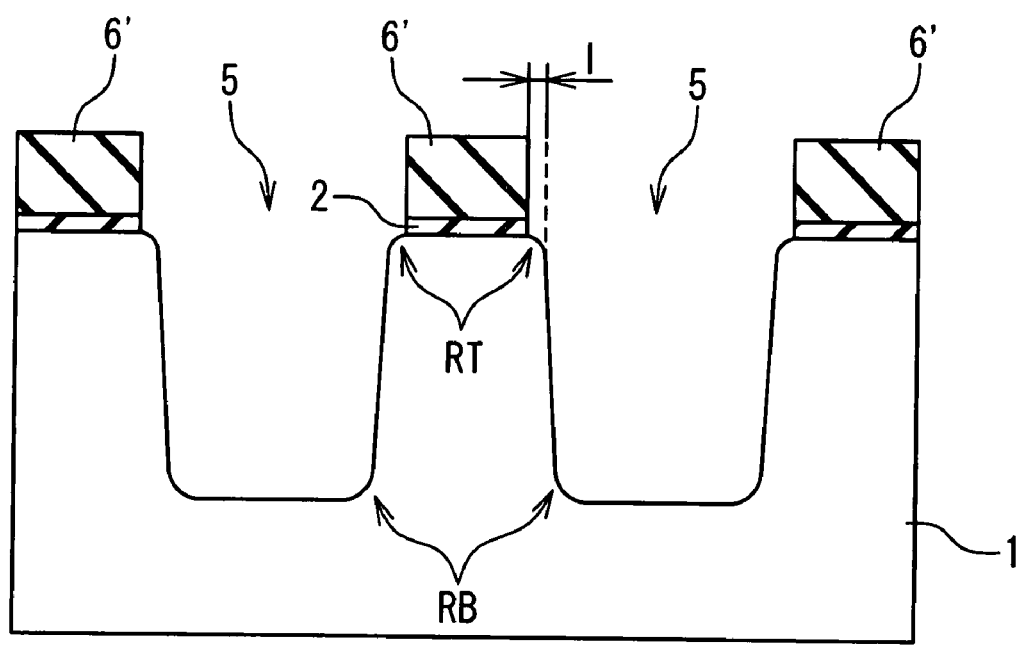

Next, an acid cleaning by the use of cleaning fluid of sulfuric acid series or hydrochloric acid series and an alkali cleaning by the use of cleaning fluid of ammonia series are performed. Subsequently, an isotropic etching of the SiN mask 6 is performed by using phosphoric acid solution or organic series solution. Consequently, as shown in FIG. 11, a part of the SiN mask 6 is removed and the edge of the SiN mask 6 backs away from a top corner of the trench 5 (hereinafter referred to as "pull-back process"). The SiN mask 6' after the isotropic etching is smaller than the original SiN mask 6 by a width of "1". After that, a wet cleaning by the use of cleaning fluid of HF series is further performed so that a natural oxide film is removed.

Next, an annealing process is performed in $H_2$ atmosphere. The temperature is set to a range from 800 to 900 degrees centigrade. As a result of the annealing process under the $H_2$ atmosphere, damages on the substrate surface caused by the above-mentioned trench etching can be recovered. Due to the damage recovery, the junction leakage characteristic is improved.

Moreover, due to the annealing in the $H_2$ atmosphere, silicon migration occurs and thus the top corner and the bottom corner of the trench 5 are rounded. In other words, as shown in FIG. 11, rounding portions RT and RB having a rounded shape are respectively formed at the top corner and the bottom corner of the trench 5 by the present annealing process. Effects obtained by the rounding portions RT and RB are as follows. During the processes of manufacturing the semiconductor device, various stresses are applied to the top corner and the bottom corner of the trench 5 and hence crystal defects are likely to occur. Due to the rounding of the top corner and the bottom corner of the trench 5, the stresses with respect to the corners are dispersed and the occurrence of the crystal defects is suppressed. As a result, the characteristics of the semiconductor device are improved.

In the present embodiment, the annealing process under the $H_2$ atmosphere plays two roles of: (1) removing the damages caused by the trench etching; and (2) forming the rounding portions RT and RB. Also, the above-mentioned pull-back process is performed in order to facilitate the formation of the rounding portion RT at the top corner.

Figure 12:
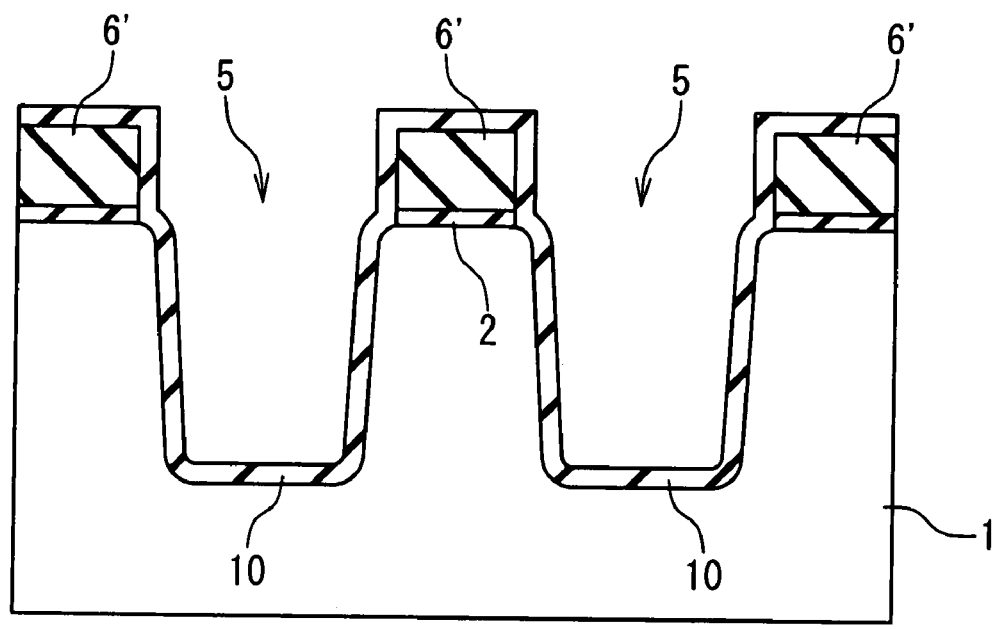

Next, an acid cleaning, an ammonia series cleaning and an HF series cleaning are performed. Subsequently, as shown in FIG. 12, a silicon oxynitride film (SiON film) 10 is blanked deposited by a CVD method. That is to say, the conventional direct thermal oxidation of the exposed surface of the trench 5 is not performed. Instead, the silicon oxynitride film 10 is formed on the exposed substrate surface in the trench 5. In depositing the silicon oxynitride film 10, it is possible to control an O/N ratio of the silicon oxynitride film 10 to be formed by appropriately changing a mixture ratio of material gas of $SiH_4$, $NH_3$, $N_2O$, NO and the like. It is preferable that refractive index of the silicon oxynitride film 10 to be formed is controlled to be in a range from 1.6 to 1.9, as will be descried later. It should be noted that disilane ($Si_2H_6$) dichlorosilane ($SiH_2Cl_2$) or the like can be used as substitute for $SiH_4$.

Figure 13:
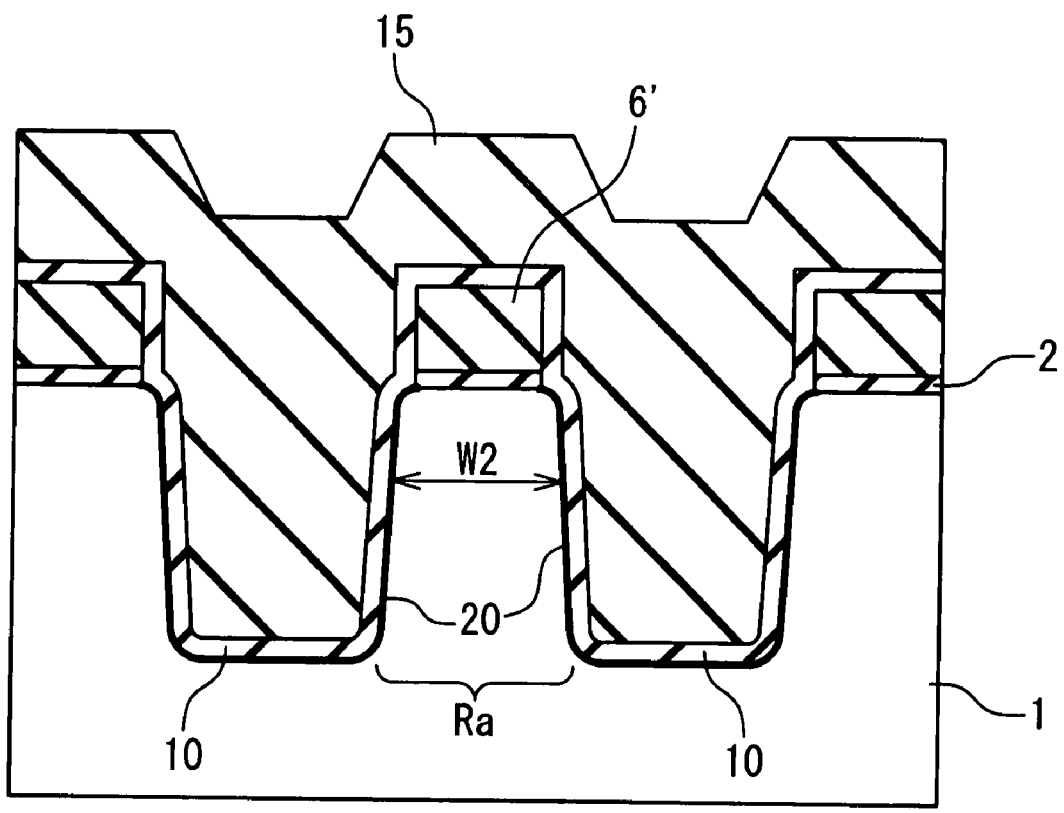

Next, as shown in FIG. 13, a CVD oxide film 15 is deposited on the silicon oxynitride film 10 by a CVD method. The CVD oxide film 15 (embedded insulating film) is so formed as to completely fill the inside of the trench 5. The used CVD method can be any of a high-density plasma CVD (HDP-CVD) method, a low-pressure CVD method and an atmospheric pressure CVD method. The above-mentioned silicon oxynitride film 10 covering the surface of the trench 5 plays a role of protecting the substrate surface from plasma during the CVD process.

It should be noted here that the silicon oxynitride film 10 has "oxygen permeability" that transmits small amount of oxygen (O). More specifically, the silicon oxynitride film 10 is capable of having the oxygen permeability of several to several tens of % by controlling its refractive index. According to the present embodiment, the property of the silicon oxynitride film 10 is applied for forming the STI structure.

More specifically, an annealing process in oxidizing atmosphere is performed after the above-described silicon oxynitride film 10 is formed, or after the above-descried CVD oxide film 15 is formed. For example, an annealing is performed under $H_2/O_2$ atmosphere and a temperature of about 700 to 800 degrees centigrade. Alternatively, an annealing is performed under $N_2/O_2$ atmosphere and a temperature of about 1100 to 1150 degrees centigrade. As a result, small amount of oxygen penetrate through the silicon oxynitride film 10, and thus the interfacial oxide film 20 that is different from the conventional thermal oxide film 110 is formed at an interface between the silicon oxynitride film 10 and the silicon substrate 1, as shown in FIG. 13. The interfacial oxide film 20 is extremely thin and its thickness is not more than 1 nm. Therefore, the interval "W2" between the adjacent STI structures, namely, the width "W2" of the active region Ra is substantially the same as the width "W1" shown in FIG. 10.

The interfacial oxide film 20 formed in the present process plays a role of preventing the leakage current characteristic from deterioration. The reason is as follows. When a silicon nitride film (SiN film) or a silicon oxynitride film (SiON film) directly contacts the silicon substrate, trap and interface state are generally formed at the interface therebetween. The trap and the interface state cause deterioration of the leakage current characteristic. According to the present embodiment, although the silicon oxynitride film 10 is once formed on the silicon substrate 1, the thin interfacial oxide film 20 is thereafter formed at the interface by the present process that utilizes the oxygen permeability of the silicon oxynitride film 10. As a result, the formation of the peculiar trap and the interface state at the interface can be prevented. That is to say, the deterioration of the leakage current characteristic can be prevented.

The oxygen permeability of the silicon oxynitride film 10 can be controlled by adjusting its refractive index. In order to transmit several to several tens of percents of oxygen (O), the refractive index of the silicon oxynitride film 10 should be set in the range from 1.6 to 1.9. It is therefore preferable in the foregoing process shown in FIG. 12 that the silicon oxynitride film 10 is formed such that the refractive index becomes 1.6 to 1.9. It should be noted that the oxygen transmission rate of several % corresponds to a case where the refractive index of the silicon oxynitride film 10 is 1.9, while the oxygen transmission rate of several tens of % corresponds a case where the refractive index is 1.6. The larger refractive index means the higher N contents, which is closer to a case of a silicon nitride film (refractive index=2.1). The oxygen transmission rate becomes smaller as the refractive index becomes larger. On the other hand, the smaller refractive index means the lower N contents, which is closer to a case of a silicon oxide film (refractive index=1.4). The oxygen transmission rate becomes larger as the refractive index becomes smaller.

Figure 14:
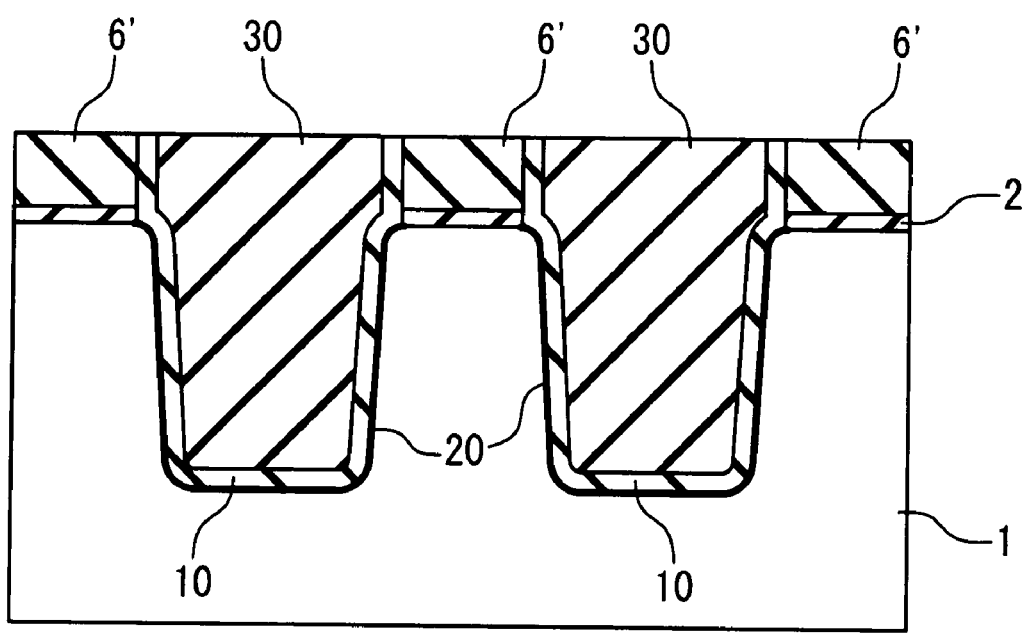

Next, as shown in FIG. 14, the surplus CVD oxide film 15 is removed by CMP (Chemical Mechanical Polishing) and the CVD oxide film 30 of the STI structure is formed. Here, the SiN mask 6' is used as a stopper. After that, the SiN mask 6' and a part of the silicon oxynitride film 10 are removed by a wet etching using phosphoric acid solution. Further, a part of the CVD oxide film 30 is removed by a wet etching using HF solution. As a result, the new STI structure 40 shown in FIG. 8 is obtained.

1-3. Effects

According to the present embodiment, as described above, the direct thermal oxidation process, which has been conventionally performed with respect to the exposed surface of the trench, is omitted and not performed. Instead, the silicon oxynitride film 10 is formed on the exposed surface of the trench 5, and then the thin interfacial oxide film 20 is formed at the interface by the process that utilizes the oxygen permeability of the silicon oxynitride film 10. The thin interfacial oxide film 20 plays a role of preventing the leakage current characteristic from deterioration. Since the conventional direct thermal oxidation process with respect to the exposed surface is omitted, the active region Ra where the transistor is formed does not shrink. Therefore, the performance of the transistor is improved as compared with the conventional technique. In other words, according to the semiconductor device provided with the STI structure 40, not only the leakage characteristic but also the performance can be improved.

Furthermore, according to the present embodiment, the annealing process in the $H_2$ atmosphere is performed immediately after the trench etching. As a result of the annealing in the $H_2$ atmosphere, damages on the substrate surface caused by the trench etching are recovered. Due to the damage recovery, the junction leakage characteristic is improved. Although the direct thermal oxidation process with respect to the exposed surface of the trench 5 is omitted, the damages caused by the trench etching can be removed. Therefore, the excellent leakage characteristic can be maintained.

Moreover, as a result of the annealing in the $H_2$ atmosphere, the rounding portions RT and RB with a rounded shape are formed at the top corner and the bottom corner of the trench 5, respectively. Due to the rounding portions RT and RB, the stresses with respect to the corners are dispersed and the occurrence of the crystal defects is suppressed. As a result, the characteristics of the semiconductor device are improved. It can be said that the annealing process under the $H_2$ atmosphere in the present embodiment plays two roles of: (1) removing the trench etching damages; and (2) forming the rounding portions RT and RB.

2. Second Embodiment

In a second embodiment of the present invention, the above-described STI structure 40 is applied to a DRAM (Dynamic Random Access Memory). In this case, a memory cell transistor is formed on the active region Ra surrounded by the STI structure 40. In addition, a capacitor is so formed as to be connected to a diffusion layer (source or drain) of the memory cell transistor (MOS transistor).

Figure 15:
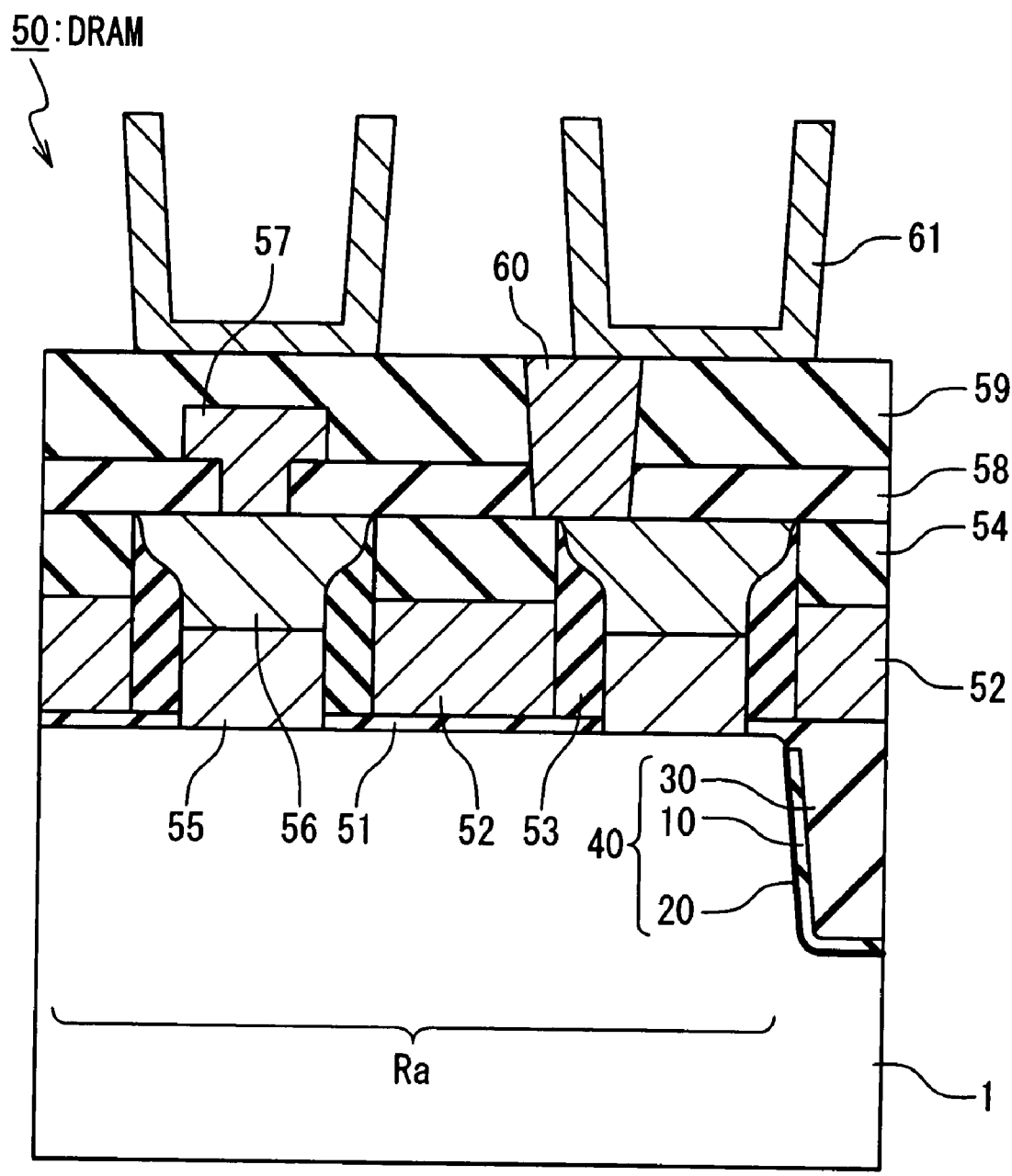
FIG. 15 is a cross-sectional view showing a structure of a semiconductor device according to a second embodiment of the present invention.

FIG. 15 illustrates an example of a cross-sectional structure of a DRAM 50 according to the present embodiment. In FIG. 15, the STI structure 40 explained above is formed in the silicon substrate 1. A gate electrode 52 is formed on the silicon substrate 1 in the active region Ra through a gate insulating film 51. For example, the gate electrode 52 is a poly-metal gate. Moreover, side walls 53 are formed on both sides of the gate electrode 52. The side wall 53 is made of, for example, a silicon nitride film. Furthermore, a silicon nitride film 54 is formed on the gate electrode 52.

Also, selective epitaxial layers 55 are so formed in a substrate contact region as to be connected to the source/drain diffusion layers of the memory cell transistor, respectively. Polysilicon films 56 serving as contact plugs are formed on the selective epitaxial layers 55, respectively. Connected to one polysilicon film 56 is a bit line 57. The bit line 57 is a metal bit line made of W/TiN/Ti and the like.

Furthermore, interlayer insulating films 58 and 59 are so formed as to cover the bit line 57. A plug 60 is so formed as to penetrate the interlayer insulating films 58 and 59 and to be connected to the other polysilicon film 56. The plug 60 is made of TiN/Ti and the like. In addition, a capacitor lower electrode 61 with a cylindrical shape is so formed as to be connected to the plug 60. The capacitor lower electrode 61 is made of a polysilicon film or a metal film of TiN, W, Ru or the like.

As described above, the deterioration of the leakage characteristic is prevented by the STI structure 40 according to the present invention. Therefore, an excellent refresh (retention) characteristic can be maintained in the DRAM 50 to which the STI structure 40 is applied. Moreover, the active region Ra does not shrink according to the STI structure 40 of the present invention. Therefore, the performance of the memory cell transistor is improved in the DRAM 50 to which the STI structure 40 is applied. In other words, the write characteristics with respect to the memory cell are improved. Even when the DRAM memory cell becomes smaller, the high performance characteristics of the memory cell transistor can be maintained.

It is apparent that the present invention is not limited to the above embodiment and may be modified and changed without departing from the scope and spirit of the invention.

What is claimed is:

1. A semiconductor device comprising:
a substrate provided with a trench; and
a device isolation structure formed in said trench,
wherein said device isolation structure includes:
a silicon oxynitride film formed on a surface of said substrate through an interfacial oxide film having a thickness of not more than 1 nm and being formed after the silicon oxynitride film by using oxygen penetrating the silicon oxynitride film; and
an embedded insulating film formed on said silicon oxynitride film, and
wherein a top corner and a bottom corner of the trench comprise a rounded portion.

2. The semiconductor device according to claim 1, wherein refractive index of said silicon oxynitride film is in a range from 1.6 to 1.9.

3. The semiconductor device according to claim 1, wherein said embedded insulating film comprises a CVD oxide film.

4. The semiconductor device according to claim 1, further comprising:
a MOS transistor formed on an active region of said substrate surrounded by said device isolation structure; and
a capacitor connected to a diffusion layer of said MOS transistor.

5. The semiconductor device according to claim 1, wherein the silicon oxynitride film comprises an oxygen-permeable silicon oxynitride film.

6. The semiconductor device according to claim 1, wherein the top corner of the trench comprises a surface of the substrate which is formed between an upper surface of the substrate and a sidewall of the trench, and the bottom corner of the trench comprises a surface of the substrate which is formed between the sidewall of the trench and the bottom of the trench.

7. The semiconductor device according to claim 1, wherein the substrate comprises an active region adjacent to the device isolation structure, and the top corner of the trench comprises a surface of the substrate which is formed between an upper surface of the substrate in the active region and a sidewall of the trench.

8. The semiconductor device according to claim 7, wherein the semiconductor device comprises a Dynamic Random Access Memory (DRAM) device including a memory cell transistor formed in the active region.

9. A semiconductor device comprising:
a substrate comprising plural trenches, a top corner and a bottom corner of the plural trenches comprising a rounded portion;
plural device isolation structures formed in the plural trenches, comprising:
a silicon oxynitride film formed on a surface of the plural trenches;
an interfacial oxide film having a thickness of not more than 1 nm and being formed after the silicon oxynitride film by using oxygen penetrating the silicon oxynitride film; and
an embedded insulating film formed on the silicon oxynitride film; and
an active region for a transistor formed in the substrate between the plural device isolation structures.

* * * * *